United States Patent
Ozawa et al.

(10) Patent No.: US 10,481,177 B2
(45) Date of Patent: Nov. 19, 2019

(54) WAFER INSPECTION METHOD

(71) Applicant: TOKYO SEIMITSU CO., LTD., Tokyo (JP)

(72) Inventors: Yuichi Ozawa, Tokyo (JP); Yasuhito Iguchi, Tokyo (JP); Tetsuo Yoshida, Tokyo (JP); Junzo Koshio, Tokyo (JP)

(73) Assignee: Tokyo Seimitsu Co. LTD., Tokyo (JP)

( * ) Notice: Subject to any disclaimer, the term of this patent is extended or adjusted under 35 U.S.C. 154(b) by 249 days.

(21) Appl. No.: 15/524,925

(22) PCT Filed: Nov. 26, 2014

(86) PCT No.: PCT/JP2014/081178
§ 371 (c)(1),
(2) Date: May 5, 2017

(87) PCT Pub. No.: WO2016/084147
PCT Pub. Date: Jun. 2, 2016

(65) Prior Publication Data
US 2017/0322236 A1 Nov. 9, 2017

(51) Int. Cl.
*G01R 1/073* (2006.01)
*G01R 31/28* (2006.01)

(52) U.S. Cl.
CPC ..... *G01R 1/07378* (2013.01); *G01R 31/2889* (2013.01)

(58) Field of Classification Search
CPC ............ G01R 1/07378; G01R 31/2889; G01R 31/08; G01R 31/28; G01R 1/0491;
(Continued)

(56) References Cited

U.S. PATENT DOCUMENTS 5,550,482 A * 8/1996 Sano .................. G01R 1/06705
324/750.19
2006/0111859 A1* 5/2006 Takahashi .......... G01R 31/2894
702/85
(Continued)

FOREIGN PATENT DOCUMENTS

JP  H04-307652  10/1992
JP  2007-311389  11/2007
(Continued)

OTHER PUBLICATIONS

International Search Report from PCT application No. PCT/JP2014/081178 dated Feb. 3, 2015, 4 pages.

*Primary Examiner* — Tung X Nguyen
*Assistant Examiner* — Robert P Alejnikov, Jr.
(74) *Attorney, Agent, or Firm* — Fattibene and Fattibene; Paul A. Fattibene

(57) ABSTRACT

A wafer inspection method improving inspection accuracy and operation efficiency. A method for performing electrical inspection by bringing into contact with pads in chips on a wafer. A chuck step S1 for heating the wafer to an inspection temperature; a first position recognition step S2 for recognizing all the positions of the pads; a second position recognition step S3 for re-recognizing, before performing the electrical inspection, the position of the pads recognizing the positional shifts of the pads due to thermal expansion; and a correction step S4 for correcting contact positions with respect to the probes, the contact positions being corrected on the basis of pad positions, which have been re-recognized in the second position recognition step S3 on the basis of the pad positions recognized in the first position recognition step S2, and which have been updated.

5 Claims, 6 Drawing Sheets

(58) Field of Classification Search
CPC .......... G01R 31/265; G01R 31/318511; G01R 31/2868; G01R 31/2874; G01R 31/311; G01R 31/318513; G01R 31/2834; G01R 31/2887
USPC .... 324/512, 757.03, 757.04, 757.05, 750.16, 324/750.19
See application file for complete search history.

(56) References Cited

U.S. PATENT DOCUMENTS

| | | | |
|---|---|---|---|
| 2007/0268033 A1* | 11/2007 | Fujita | G01R 31/2891 324/750.03 |
| 2008/0018352 A1 | 1/2008 | Chiba et al. | 324/758 |
| 2008/0150565 A1* | 6/2008 | Nayak | G01R 31/2891 324/750.16 |
| 2009/0128178 A1* | 5/2009 | Matsuzawa | G01R 31/2891 324/762.05 |
| 2009/0195263 A1* | 8/2009 | Yano | G01R 31/2891 324/762.06 |
| 2015/0153742 A1* | 6/2015 | Ko | G05D 3/12 700/213 |

FOREIGN PATENT DOCUMENTS

| | | |
|---|---|---|
| JP | 2007-324189 | 12/2007 |
| JP | 2008-028082 | 2/2008 |
| JP | 2009-204384 | 9/2009 |
| JP | 2009-278007 | 11/2009 |
| JP | 2010-245508 | 10/2010 |

* cited by examiner

| | PAD | CHARACTERISTICS OF PAD SHAPES |
|---|---|---|
| INFORMATION 1 | | COORDINATES OF APEX, CROSS-SHAPE, WHITE... |
| INFORMATION 2 | | WIDTH, HEIGHT, HEXAGON, WHITE, STRIPE |
| INFORMATION 3 | | WIDTH, HEIGHT, ELLIPSE, BLACK... |

WAFER INSPECTION METHOD

TECHNICAL FIELD

The present invention relates to a wafer inspection method and, in particular, a wafer inspection method which simultaneously brings a plurality of probes disposed on a probe card into contact with pads of semiconductor chips formed on a semiconductor wafer (to be simply referred to as a "wafer" hereinafter) to perform electrical inspection.

BACKGROUND ART

In semiconductor manufacturing steps, various processes to a thin disk-like wafer to form a plurality of chips (dies) each having an electric device. Each of the chips are inspected with respect to electric characteristics. Thereafter, the chips are cut off by a dicer, and each of the chips is fixed on a lead frame or the like and assembled as an electronic device. The inspection of electric characteristics is performed by a probe card and a tester. The wafer is fixed to a chuck on a stage, and probes are brought into contact with the pads of the chips. The tester supplies an electric power and various test signals from terminals connected to the probes, and the tester analyzes signals output to the pads of the chips to check whether the chips normally operate (for example, see Patent Literature 1).

An electronic device has a wide array of uses, and is used in a wide temperature range. For this reason, when a wafer on electronic devices are disposed is to be inspected, for example, the inspection must be performed at a high temperature at which a wafer placed on a chuck has a temperature of 200° C. and at a low temperature at which the wafer has a temperature of −55° C.

A plurality of chips are disposed in lines on a wafer, and a plurality of pads are disposed on the chips, respectively. The shapes of the pads may be square shapes, pentagonal shapes, octagonal shapes, polygonal shapes, circular shapes, or the like. The surfaces of the pads may be plain surfaces, striped-pattern surfaces, geometrical-pattern surfaces, or the like. The materials of the pads may be aluminum, gold, solder bumps, and the like.

When each of the chips is to be electrically inspected, the inspection is performed such that a plurality of probes disposed on a probe card to correspond to a plurality of pads formed on each chip are simultaneously brought into contact with the pads, respectively. For this reason, before the electrical inspection is started, on the basis of the pad information, a position of the pad on each of the chips disposed on the wafer must be recorded. In the wafer inspection, positions of the pads on the wafer and positions of the probes are calculated on the basis of position information of the pads on each of the chips, and each of the probes must be reliably brought into contact with the center of each of the pads.

In the registration of the pad position, an operator moves one chip with respect to a microscope or a camera (to be generically referred to as a camera hereinafter) to monitor the pad in a video image on the camera and to record the position of the pad on a control unit. In the control unit, pad position information of each wafer type is created on the basis of the recorded data, correction calculation with respect to the probe positions on the probe card is performed on the basis of the pad position information, and the inspection is performed after the position correction is performed. Note that, as an operation time required to register the positions of the pads, an operation time of about 2 to 3 seconds is required for one pad of one chip at present. Thus, an operation time required for registration of all the pads of one chip is obtained by multiplying the number of registered pads by the operation time (2 to 3 seconds) per pad. When the number of pads increases, the operation time increases.

CITATION LIST

Patent Literature

PTL 1: Japanese Patent No. 4878919

SUMMARY OF INVENTION

Technical Problem

However, in order to register the pad position information as described above, an operation time of several minutes to hundreds of minutes is required for one chip. In addition, when measurement is performed at 200° C., the inspection is performed in a high-temperature atmosphere. For this reason, various members supporting the camera, lenses, and the chips thermally expand, a degree of influence of heat received at a position where position recognition is started is different from a degree of influence of heat received at a position where the position recognition is ended.

Furthermore, this phenomenon will be described below with reference to drawings. FIG. 5 shows, when a recognition operation is performed in a high-temperature atmosphere at 200° C., variations in displacements in X-axis, Y-axis, and Z-axis directions serving as optical axes of the camera with elapsed time. In the drawing, the ordinate denotes a displacement (unit: μm), and the abscissa denotes time (unit: minute). In FIG. 5, the displacements in the X-, Y-, and Z-axis directions largely change depending on thermal expansion until about 21 minutes have elapsed, and the variations are maintained without changing after 21 minutes have elapsed.

Thus, influences of the variations in the X-, Y-, and Z-axis directions of the camera appear as shown in FIG. 6, for example. More specifically, in FIG. 6, when it is assumed that a recognizing operation is performed while a chip 50 moves in a direction of an arrow 60 with respect to the camera, since both a position P1$a$ of an actual pad 51 immediately after the recognizing operation is started and a position P2$a$ of the pad 51 recognized by the camera are not influenced by heat, the positions are recognized as almost the same positions. However, when the time has elapsed, the positions begins to be influenced by heat such as thermal expansion of a housing itself holding the camera or thermal expansion of the lenses. After 21 minutes have elapsed, the position P2$n$ of the actual pad 51 and the position P1$n$ of the pad 51 recognized by the camera are largely different from each other.

For this reason, when a wafer is inspected by using pad position information obtained by performing the recognizing operation once, an influence of recognition at the beginning of the operation is different from an influence of thermal expansion on recognition at the end of the operation are different from each other, a difference occurs between the pad and the probe, and the probe may not be brought into contact with the center position of the pad. Thus, a method of calculating changes in thermal expansion of the various members supporting the camera and variations of the lenses in advance to perform correction, a method of leaving the device untouched in a high-temperature atmosphere for at least 20 minutes or longer, preferably, 80 minutes or longer and performing a recognizing operation after the housing of the camera, the lenses, and the like are stabilized, and registering the positions, or the like conventionally used.

However, in the method of calculating the changes in thermal expansion of the various members supporting the camera or the variations of the lenses to perform correction, the correction is absolutely performed on the basis of presumption, and sufficient correction is not performed. For this reason, the correction also influences inspection accuracy. On the other hand, when the device is left untouched for a long period of time in a high-temperature atmosphere to perform a recognizing operation after the camera and the like are stabilized, problems such as a long-time operation and poor operation efficiency occur.

Thus, technical problems to be solved to provide a wafer inspection method which makes it possible to improve inspection accuracy and a throughput without being influenced by heat are posed, and the present invention is to solve the problems.

Solution to Problems

The present invention has been proposed to achieve the above object, an invention described in an embodiment provides a wafer inspection method which simultaneously brings a plurality of probes disposed on a probe card into contact with a plurality of pads being on chips on a wafer to perform an electrical inspection, includes: a chuck step of holding the wafer with a wafer chuck and heating the wafer to an inspection temperature; a first position recognition step of recognizing all the positions of the pads on the basis of pad information of one arbitrary chip being in the wafer; a second position recognition step of, before electrical inspection is performed, re-recognizing the positions of the pads to recognize positional shifts of the pads occurring due to thermal expansion caused by heat of the wafer chuck; and a correction step of updating position information of the pads recognized in the second position recognition step on the basis of the positions of the pads in the first position recognition step to correct contact positions with respect to the probes.

According to the method, two position recognitions, i.e., the position recognition of the pads in the first position recognition step performed in a situation in which thermal deformation progresses and the position recognition of the pads in the second position recognition step performed in a situation in which the thermal deformation is stopped (influence of heat is reduced by quickly performing position recognition of the pads) are performed. The positions of the pads are updated on the basis of the positions of the pads recognized in the first position recognition step, and the positions of the probes with respect to the pads are corrected, and the distal ends of the probes are brought into contact with the centers of the pads to make it possible to accurately perform the inspection.

An invention described in another embodiment provides a wafer inspection method wherein the second position recognition step registers all or some of the pads in the chip.

According to the method, in the second position recognition step performing the second recognition, only all or some of the pads in the chip are recognized, and, on the basis of the recognition result, the positions of the pads can be easily updated. For this reason, a time required to register the pads can be shortened, and improvement of operation efficiency can be expected.

An invention described in another embodiment provides a wafer inspection method wherein the second position recognition step recognizes all the chips in the chip.

According to this method, in the second position recognition step performing the second recognition, the positions of all the pads in the chip are recognized, and the positions of the pads are updated on the basis of the recognition result. For this reason, the registration can be accurately performed with a less influence of heat, and inspection accuracy can be expected to be improved.

An invention described in another embodiment provides a wafer inspection method wherein the second position recognition step recognizes some of the chips in the wafer.

According to this configuration, in the second position recognition step performing the second recognition, only all or some of pads in the wafer are recognized, and differences between the pads can be easily estimated from the recognition result. For this reason, a time required to register the positions can be shortened, and operation efficiency can be expected to be improved.

An invention described in another embodiment provides a wafer inspection method wherein the position recognitions of the pads in the first position recognition step and the second position recognition step are performed on the basis of information such as pad shapes, pad surface patterns, and pad materials being in the one arbitrary chip registered in an arithmetic device in advance.

According to this method, the pad information is registered in advance to make it possible to omit an operation which records the positions of the pads in the arithmetic device by manual registration performed by visual check by an operator in the first position recognition step and the second position recognition step, and operation efficiency can be expected to be improved.

Advantageous Effects of Invention

According to the present invention, two position recognitions, i.e., the position recognition of pads in the first position recognition step performed in a situation in which thermal deformation progresses and the position recognition of the pads in the second position recognition step performed in a situation in which the thermal deformation is stopped are performed to update the positions of the pads recognized in the second position recognition step on the basis of the positions of the pads recognized in the first position recognition step. Since positions for the probe with respect to the registered pads are corrected, correction accuracy is improved. Inspection can be accurately performed while the probes are brought into contact with almost the centers of all the pads, respectively. Since the position recognition of the pads can be immediately started without waiting until heat generated by the chuck or the like is stable, operation efficiency can be expected to be improved.

DESCRIPTION OF EMBODIMENTS

In order to achieve an object to provide a wafer inspection method which makes it possible to improve inspection accuracy and operation accuracy, the present invention provides a wafer inspection method which simultaneously brings a plurality of probes disposed on a probe card into contact with a plurality of pads being on chips on a wafer to perform an electrical inspection, includes: a chuck step of holding the wafer with a wafer chuck and heating the wafer to an inspection temperature; a first position recognition step of recognizing all the positions of the pads on the basis of pad information of one arbitrary chip being in the wafer; a second position recognition step of re-recognizing the positions of the pads to recognize positional shifts of the pads occurring due to thermal expansion caused by heat of the wafer chuck; and a correction step of updating position information of the pads recognized in the second position recognition step on the basis of the positions of the pads in the first position recognition step to correct contact positions with respect to the probes.

A preferred embodiment of wafer inspection method according the present invention will be described below in detail with reference to the accompanying drawings.

Embodiment

Figure 1:
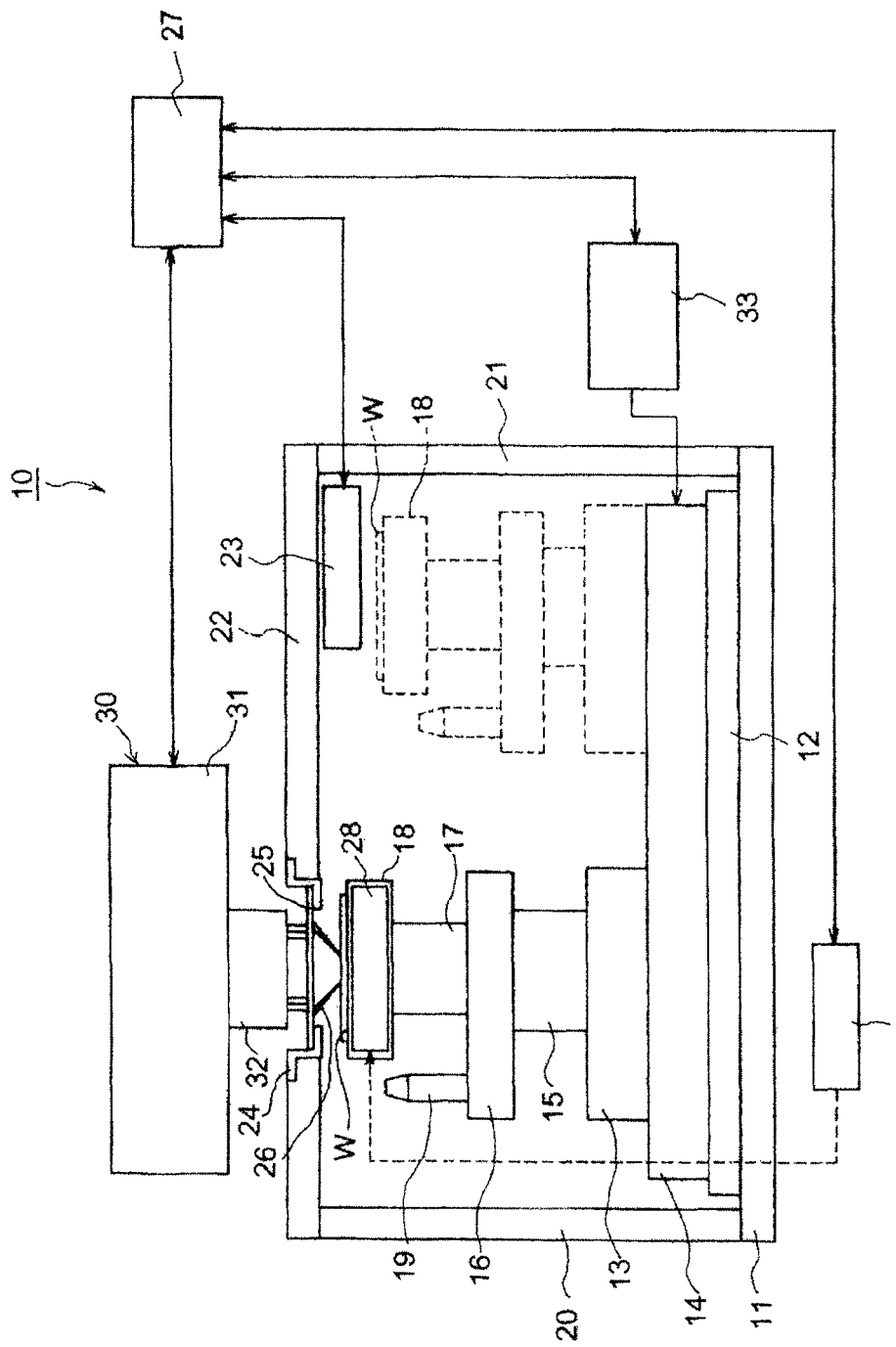
FIG. 1 is a diagram showing a basic configuration of a wafer inspection device which brings probes of a probe card into contact with pads on a wafer to perform electrical inspection.

FIG. 1 is a diagram showing a basic configuration of a wafer inspection device which brings pads on a wafer into contact with probes on a probe card to perform electrical inspection for a chip. As showing in the drawing, a wafer inspection device 10 includes, a base 11, a moving base 12 disposed on the base 11, a Y-axis moving unit 13, an X-axis moving unit 14, a Z-axis moving unit 15, a Z-axis moving table 16, a θ rotating unit 17, a stage 18, a probe positioning camera 19, support posts 20 and 21, a head stage 22, a wafer alignment camera 23 disposed on a support post (not shown), a card holder 24 disposed on a head stage 22, a probe card 25 mounted on the card holder 24, and a control unit 27 controlling the wafer inspection device 10 as a whole.

Figure 2:
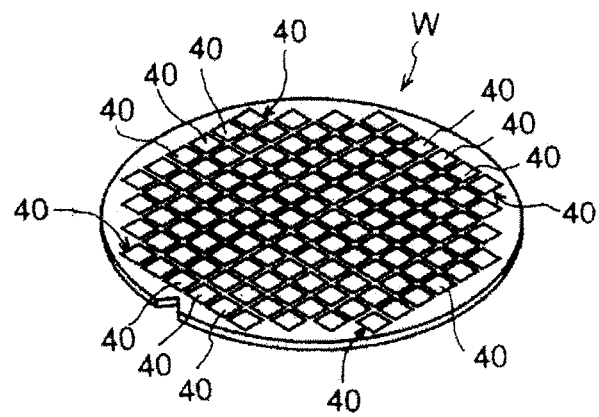
FIG. 2 is a perspective view showing an example of a wafer.
Figure 3:
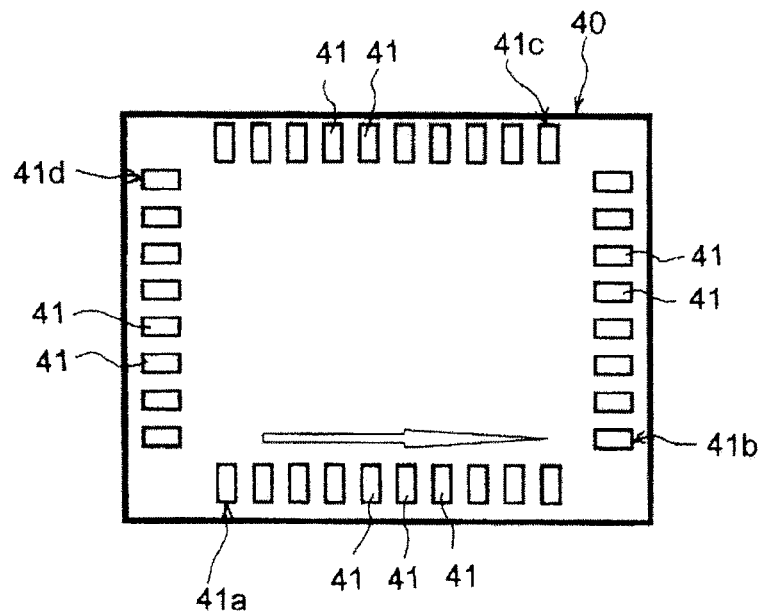
FIG. 3 is a diagram for explaining an example of pads disposed on a chip and an example of inspection.

FIG. 2 shows an example of a wafer W used in the wafer inspection device 10, and a plurality of chips 40 are disposed on the wafer W. As shown in FIG. 3, a plurality of pads 41 serving as electrodes are disposed on each of the chips 40. The shapes and arrangements of the pads 41 change depending on wafer types.

In FIG. 1, the control unit 27 is to control the wafer inspection device 10 as a whole according to a predetermined procedure, and is, for example, a computer.

The probe card 25 includes a probe 26 of a cantilever type, a spring pin type, a vertical needle type, or a crown pin type disposed thereon. The moving base 12, the Y-axis moving unit 13, the X-axis moving unit 14, the Z-axis moving unit 15, the Z-axis moving table 16, and the θ rotating unit 17 constitute a moving/rotating mechanism moving the stage 18 in the three axis directions and rotating the stage 18 around the Z axis. The operations are driven by a stage moving control unit 33 controlled by the control unit 27.

The probe card 25 has the probes 26 arranged to correspond to the arrangement of the pads 41 of the chip 40 to be inspected, and is replaced depending on the types of the chips 40 to be inspected.

In the stage 18, a heater/coolant path 28 to set the stage 18 at a high temperature or a low temperature is disposed, and a temperature control unit 29 controlled by the control unit 27 adjusts an electric power supplied to the heater and the temperature of a coolant circulated in the coolant path. In this manner, the temperature of the stage 18 can be adjusted to a desired temperature ranging from a high temperature to a low temperature, and, depending on the temperature, the wafer W held on the stage 18 can be inspected at a desired temperature.

The tester 30 includes a tester main body 31 and a contact ring 32 disposed on the tester main body 31. A terminal (not shown) coupled to each of the probes 26 is disposed on the probe card 25, and the contact ring 32 has a spring probe disposed to be in contact with the terminal. The tester main body 31 is held by a support mechanism (not shown) with respect to the wafer inspection device 10.

When the chip 40 on the wafer W is to be inspected, the Z-axis moving table 16 is moved to located the probe positioning camera 19 at a position below the probe 26, and the probe positioning camera 19 detects a distal end position of the probe 26. The detection and correction/adjustment of the distal end position of the probe 26 must be performed each time the probe card 25 is replaced and the wafer type is changed.

When the wafer type is changed, on the basis of pad position information in which the positions of the pads 41 of the wafer type are registered in advance, contact positions between the probes 26 of the probe card 25 and the pads 41 are calculated. Thus, the positions of the pads 41 of the wafer type are detected in advance by the wafer alignment camera 23, and the positions are calculated as pad position information.

Figure 4:
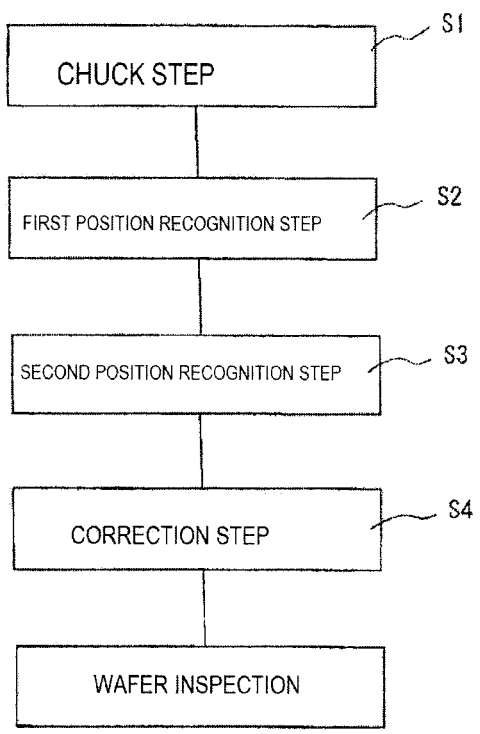
FIG. 4 is a flow chart for explaining an example of an inspection procedure of a wafer according to the present invention.
Figure 5:
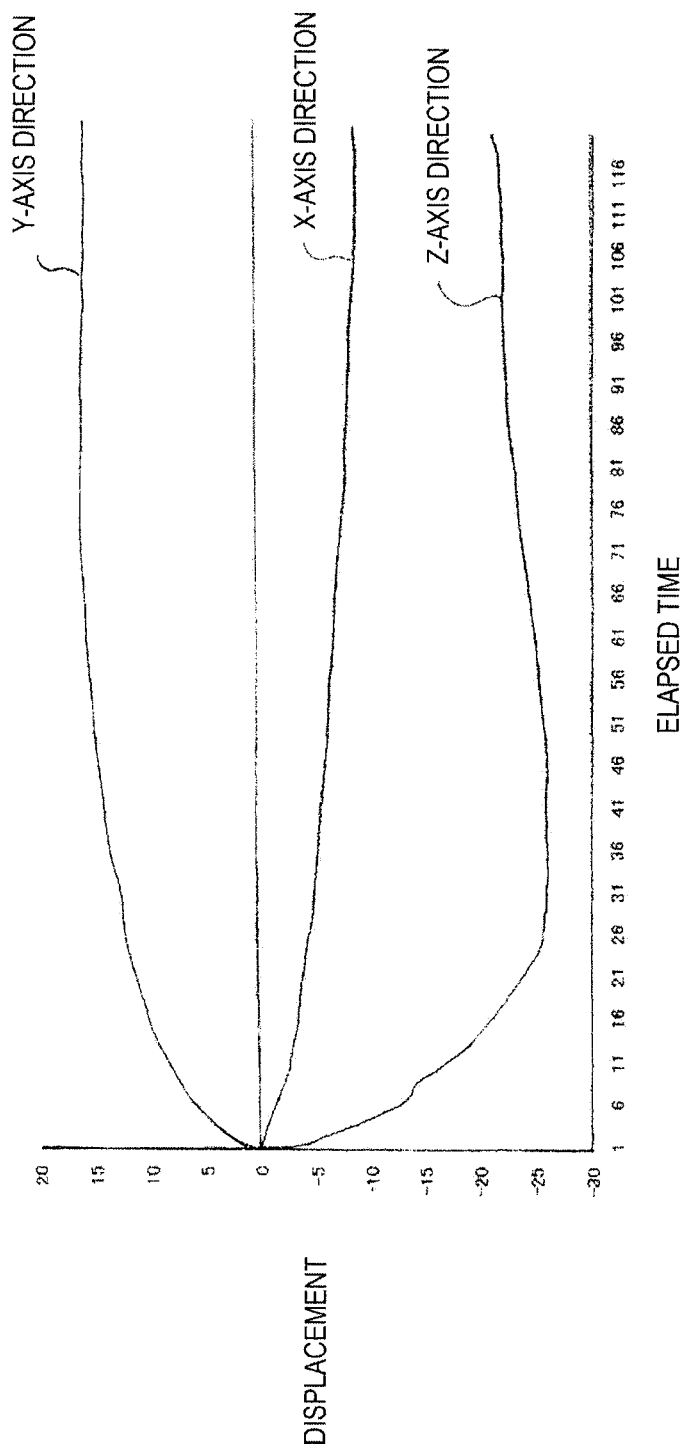
FIG. 5 is a graph for explaining elapsed time and X-, Y-, and Z-direction displacements of microscope optical axes caused by a change in temperature.

FIG. 4 is a flow chart for explaining a procedure of registering the pads 41 in units of types of the wafer W to register pad position information. When the pad position information is to be registered, the control unit 27 controls the X-axis moving unit 14 to dispose the stage 18 holding the wafer W to a position on the lower side of the wafer alignment camera 23 indicated by a dotted line in FIG. 1 and increases the temperature of the stage 18 to an inspection temperature (for example, −55° C. to 200° C.) (step S1: chuck step).

Subsequently, on the lower side of the wafer alignment camera 23, the stage 18 holding the wafer W is moved from a reference position in X and Y directions with respect to the wafer alignment camera 23. At the same time, an operator manually registers the positions of the pads 41 displayed on a monitor (not shown) of the wafer alignment camera 23 and sequentially records the registered positions in the control unit 27. This operation is performed to all or some of the pads 41 of one chip 40 (step S2: first position recognition step). A direction in which the recognition progresses is, for example, an X direction or a Y direction in an arbitrary area of the chip, the four sides of the chip, a direction of zigzag scanning for the entire chip, or the like, and may be arbitrary.

Figures 6, 7:
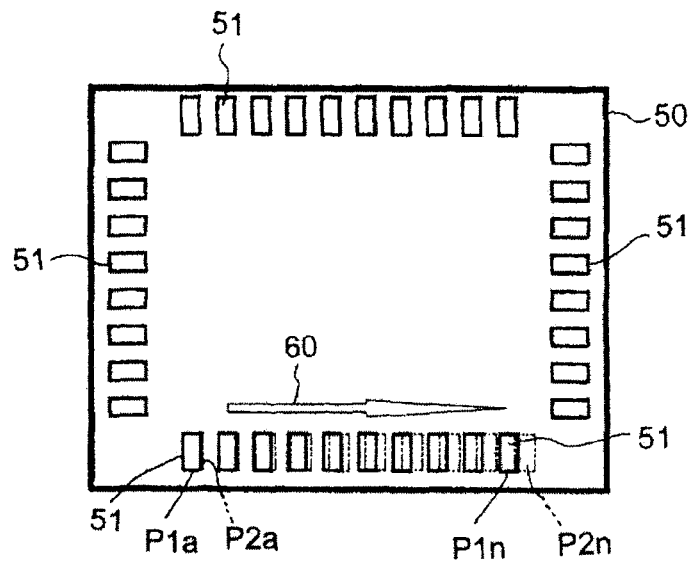
FIG. 6 is a diagram for explaining an example of pads disposed on a conventional chip and an example of inspection.
FIG. 7 is a diagram showing an example of types of pads.

As the pads 41, for example, pads having various forms as shown in FIG. 7 are supposed. More specifically, as shown in FIG. 7, a pad having a cross-shape is registered as information 1, a hexagonal pad is registered as information 2, an elliptic pad is registered as information 3, and the form information is registered in the control unit 27 in advance. On the basis of the information 1 to information 3 in FIG. 7, the pieces of information are collated with the pads 41 on an image displayed by the microscope 23 to recognize all the pads 41.

Subsequently, the chip 40 recognized in the first position recognition step 1, for example, the detected chip 40 is subjected to the second recognition inspection, and an inspection result is recorded in the control unit 27 as in the first recognition inspection (step S3: second position recognition step). When the recognition is performed in the second position recognition step S3, only the pads 41 at specific positions indicated by reference numerals 41a, 41b, 41c, and 41d in FIG. 3 in the chip 40 may be extracted and recognized. In this manner, an operation time can be shortened, and operation efficiency can be improved.

The control unit 27 determines the positions of the pads 41 recognized in the first position recognition step S2 and the positions of the pads 41 recognized in the second position recognition step S3, corrects influences caused by thermal expansion, and registers the positions as pad position information. (step S4: correction step). More specifically, differences between the positions of the pads 41 recognized in the first position recognition step S2 and the positions of the pads 41 recognized in the second position recognition step S3 are changes of the housing, the lenses, and the like of the wafer alignment camera 23 caused by thermal expansion. The probes 26 are brought into contact with the pads 41 by using the pad position information to exclude an influence of thermal deformation, and the probes 26 are brought into contact with the center positions of the pads 41 to make it possible to accurately perform the inspection.

Thus, in the method according to the present invention, even though the first position recognition is performed in a situation in which a thermal change progresses, by the second position recognition of the pads 41 performed in a state in which the thermal change is stable, the positions of the pads 41 caused by an influence of thermal expansion can be updated. For this reason, in inspection of the next wafer W, the pads 41 can be brought into contact with the probes while contact positions therebetween are corrected. In this manner, the probes 26 are accurately brought into contact with the centers of the pads 41 to make it possible to accurately perform inspection. In the first position recognition step S2, even though position recognition is started before the temperature of the stage 18 reaches an inspection temperature, positions obtained after an influence of heat is received are recognized in the second position recognition step S3, and amounts of correction can be easily recognized on the basis of the differences between the positions obtained in the first position recognition step S2 and the second position recognition step S3. For this reason, the operation need not be waited until the temperature of the stage 18 reaches the inspection temperature, and operation efficiency can be expected to be improved.

Figure 8A:
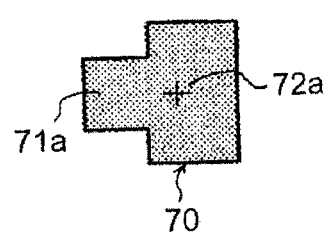
FIGS. 8A and 8B are diagrams for explaining applications of pad information, and showing cases in which center positions of needle-standing regions are set as different positions, respectively.
Figure 8B:
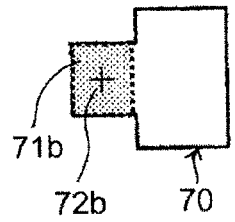

In addition to the information 1 to information 3 shown in FIG. 7 described in the embodiment, for example, pieces of information shown in FIGS. 8A and 8B can be registered. As shown in FIG. 8A, when a needle-standing region 71a is in the same region in the pad 70, a contact position between the needle-standing region 71a and the probe is a needle-standing center position 72a. When information of another region is registered as the needle-standing region 71b in the pad 70, a contact position between the needle-standing region 71b and the probe is a needle-standing center position 72b. Thus, with respect to the region of the pad 70, the needle-standing region and the bonding region can be discriminated from each other, and the probe can be prevented from being brought into contact with an unintended position in a pad region.

Various modifications of the present invention can be effected without departing from the spirit and scope of the invention, and the present invention includes the modifications, as a matter of course.

INDUSTRIAL APPLICABILITY

The present invention used when inspection of a chip on a wafer is performed has been described. However, the present invention can also be applied to a case except for the case in which a chip on a wafer is inspected.

REFERENCE SIGNS LIST

10 . . . wafer inspection device
11 . . . base
12 . . . moving base
13 . . . Y-axis moving unit
14 . . . X-axis moving unit
15 . . . X-axis moving unit
16 . . . Z-axis moving table
17 . . . θ rotating unit
18 . . . stage
19 . . . probe positioning camera
20, 21 . . . support post
22 . . . head stage
23 . . . wafer alignment camera
24 . . . card holder
25 . . . probe card
26 . . . probe
27 . . . control unit
28 . . . heater/coolant path
30 . . . tester
31 . . . tester main body
32 . . . contact ring
33 . . . stage moving control unit
40 . . . chip
W . . . wafer

What is claimed is:

1. A wafer inspection method which simultaneously brings a plurality of probes disposed on a probe card into contact with a plurality of pads being on chips on a wafer to perform an electrical inspection, comprising:
a chuck step of holding the wafer with a wafer chuck and heating the wafer to an inspection temperature;
a first position recognition step of recognizing all the positions of the pads on the basis of pad information of one arbitrary chip being in the wafer while thermal deformation is progressing;
a second position recognition step of re-recognizing the position of at least one but less than all of the pads to recognize positional shifts of the pads occurring due to thermal expansion caused by heat of the wafer chuck before electrical inspection is performed; and
a correction step of updating position information of the pads recognized in the second position recognition step on the basis of the positions of the pads in the first position recognition step to correct contact positions with respect to the probes.

2. The wafer inspection method according to claim 1, wherein the second position recognition step recognizes some of the pads in the chip.

3. The wafer inspection method according to claim 1, wherein the correction step corrects positional shifts from the pads of some of the chips caused by thermal expansion.

4. The wafer inspection method according to claim 1, wherein detection of the positions and shapes of the pads performed in the first position recognition step and the second position recognition step is performed on the basis of information such as pad shapes, pad surface patterns, pad materials being in the arbitrary chip registered in an arithmetic device in advance.

5. A wafer inspection method using probes disposed on a probe card contacting pads on chips on a wafer for performing an electrical inspection, comprising the steps of:

holding the wafer with a wafer chuck;

heating the wafer to begin approaching a predetermined temperature;

recognizing a first position of all of the pads on the chips on the wafer prior to reaching the predetermined temperature;

re-recognizing a second position of at least one but less than all of the pads on the chips on the wafer after reaching the predetermined temperature and thermal distortion has stopped;

calculating updated position information of the pads based on the first position of the pads and the second position of the at least one but less than all of the pads due to the thermal distortion; and adjusting the position of the probes relative to the pads based on the updated position information of the pads to obtain a desired contact location of the probes on the pads;

whereby position recognition of the pads is capable of being started without waiting for the wafer to reach the predetermined temperature and thermal stability improving operation efficiency.

\* \* \* \* \*